United States Patent
Chen et al.

(10) Patent No.: US 11,444,113 B2
(45) Date of Patent: Sep. 13, 2022

(54) DISPLAY APPARATUS

(71) Applicant: Au Optronics Corporation, Hsinchu (TW)

(72) Inventors: Ming-Yao Chen, Hsinchu (TW); Jui-Chi Lo, Hsinchu (TW); Mao-Teng Ho, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 295 days.

(21) Appl. No.: 16/843,909

(22) Filed: Apr. 9, 2020

(65) Prior Publication Data

US 2021/0134866 A1    May 6, 2021

(30) Foreign Application Priority Data

Oct. 30, 2019   (TW) ................................. 108139222

(51) Int. Cl.
| | |
|---|---|
| *H01L 27/146* | (2006.01) |
| *G02F 1/1335* | (2006.01) |
| *G02F 1/1362* | (2006.01) |
| *G02F 1/1368* | (2006.01) |
| *G06V 40/13* | (2022.01) |

(52) U.S. Cl.
CPC ...... *H01L 27/14623* (2013.01); *G02F 1/1368* (2013.01); *G02F 1/133512* (2013.01); *G02F 1/136209* (2013.01); *G06V 40/13* (2022.01); *H01L 27/14678* (2013.01)

(58) Field of Classification Search
None
See application file for complete search history.

(56) References Cited

U.S. PATENT DOCUMENTS

| 10,024,655 | B2 | 7/2018 | Raguin et al. | |
|---|---|---|---|---|
| 2017/0161543 | A1* | 6/2017 | Smith | G06V 40/1318 |
| 2018/0096186 | A1* | 4/2018 | Mienko | G06V 40/13 |
| 2020/0012833 | A1* | 1/2020 | Jin | G06V 40/1329 |
| 2020/0219455 | A1* | 7/2020 | Lius | G02F 1/133617 |

* cited by examiner

*Primary Examiner* — Benjamin P Sandvik
(74) *Attorney, Agent, or Firm* — JCIPRNET

(57) ABSTRACT

A display apparatus includes a first substrate, a plurality of pixel structures disposed on the first substrate, a light sensor disposed on the first substrate, an insulation layer disposed on the light sensor, a first light shielding pattern, a second substrate disposed opposite to the first substrate, a second light shielding pattern, and a display medium. Each pixel structure includes an active device and a pixel electrode electrically connected to the active device. The first light shielding pattern is disposed on the insulation layer and located above the light sensor. The second light shielding pattern is disposed on the second substrate and has an opening. The opening of the second light shielding pattern and the first light shielding pattern define at least one slit, and the at least one slit and the light sensor are partially overlapped. The display medium is disposed between the first substrate and the second substrate.

14 Claims, 15 Drawing Sheets

DISPLAY APPARATUS

CROSS-REFERENCE TO RELATED APPLICATION

This application claims the priority benefit of Taiwan patent application serial no. 108139222, filed on Oct. 30, 2019. The entirety of the above-mentioned patent application is hereby incorporated by reference here and made a part of this specification.

BACKGROUND

Technical Field

The disclosure relates to a photoelectric apparatus and more particularly to a display apparatus.

Description of Related Art

The design of high screen ratio and full screen has become the design of mainstream panels of small and medium sizes. In order to achieve the high screen ratio and full screen, a plurality of light sensors for fingerprint recognition may be incorporated into a pixel array substrate of a display panel to form an in-cell fingerprint panel. The in-cell fingerprint panel performs a full-screen fingerprint recognition function (the fingerprint recognition function is not performed just on fixed points) and may support a variety of applications, so as to improve user experience and increase the added value of the display panel. However, the range of an incident angle at which a light beam is transmitted to a light sensor is excessively broad, which leads to the obscurity of the obtained fingerprint image.

SUMMARY

The disclosure provides a display apparatus with good performance.

The display apparatus provided in an embodiment of the disclosure includes a first substrate, a plurality of pixel structures, a light sensor, an insulation layer, a first light shielding pattern, a second substrate, a second light shielding pattern, and a display medium. The pixel structures are disposed on the first substrate. Each of the pixel structures includes an active device and a pixel electrode electrically connected to the active device. The light sensor is disposed on the first substrate. The insulation layer is disposed on the light sensor. The first light shielding pattern is disposed on the insulation layer and located above the light sensor. The second substrate is disposed opposite to the first substrate. The second light shielding pattern is disposed on the second substrate and has an opening. The opening of the second light shielding pattern and the first light shielding pattern define at least one slit, and the at least one slit and the light sensor are partially overlapped. The display medium is disposed between the first substrate and the second substrate.

In an embodiment of the disclosure, the display apparatus further includes a backlight module, wherein a light intensity distribution of the backlight module has a minimum full width at half maximum (FWHM) in a convergence direction, a long side of the at least one slit is arranged along a long side direction, an included angle $\alpha$ is between the long side direction and the convergence direction, and $\alpha < 45°$.

In an embodiment of the disclosure, a distance x1 is between a long side of the first light shielding pattern and an edge of the opening of the second light shielding pattern in a first direction parallel to the first substrate, a distance z1 is between a surface of the second light shielding pattern facing the second substrate and a surface of the second light shielding pattern facing the second substrate in a second direction perpendicular to the first substrate, and the distance x1 and the distance z1 satisfy a formula:

$$15° < \tan^{-1}\left(\frac{x1}{z1}\right) < 35°.$$

In an embodiment of the disclosure, a distance x2 is between a long side of the first light shielding pattern and an edge of a light sensing layer of the light sensor in a first direction parallel to the first substrate, a distance z2 is between a surface of the light sensing layer facing the first substrate and a surface of the first light shielding pattern facing the second substrate in a second direction perpendicular to the first substrate, and the distance x2 and the distance z2 satisfy a formula:

$$15° < \tan^{-1}\left(\frac{x2}{z2}\right) < 35°.$$

In an embodiment of the disclosure, a long side of the at least one slit is arranged along a long side direction, two end portions of the first light shielding pattern are arranged in the long side direction, and two end portions of the first light shielding pattern and a physical portion of the second light shielding pattern are overlapped.

In an embodiment of the disclosure, the at least one slit includes two opposite first slits separated by a first light shielding pattern.

In an embodiment of the disclosure, the at least one slit further includes a second slit located inside the first light shielding pattern.

In an embodiment of the disclosure, the first light shielding pattern and the pixel electrode of one of the pixel structures are overlapped.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles described herein.

DESCRIPTION OF THE EMBODIMENTS

Figure 1:
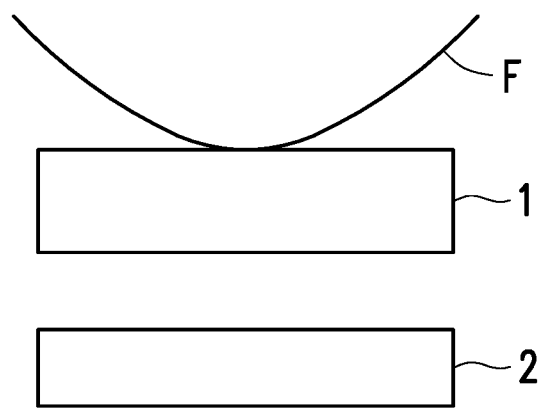
FIG. 1 is a schematic cross-sectional view of a display apparatus 10 according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Various embodiments of the disclosure are disclosed in the drawings, and for the sake of clarity, many of the practical details are set forth in the following description. However, it should be understood that these practical details should not be used to limit the disclosure. In other words, these practical details are not necessary in certain embodiments of the disclosure. In addition, to simplify the drawings, some conventional structures and elements in the drawings will be shown in a simple and schematic manner.

Throughout the specification, the same reference numerals in the accompanying drawings denote the same or similar elements. In the accompanying drawings, thicknesses of layers, films, panels, regions and so on are exaggerated for clarity. It should be understood that when an element such as a layer, film, region or substrate is referred to as being "on" or "connected to" another element, it can be directly on or connected to the other element, or intervening elements may also be present between said element and said another element. In contrast, when an element is referred to as being "directly on" or "directly connected to" another element, there are no intervening elements present between said element and said another element. As used herein, the term "connected" may refer to physically connected and/or electrically connected. Therefore, intervening elements may be present between two elements when the two elements are "electrically connected" or "coupled" to each other.

It should be understood that, although the terms "first", "second", etc., may be used herein to describe various elements, components, regions, layers and/or sections, these elements, components, regions, layers, and/or sections should not be limited by these terms. These terms are used to distinguish one element, component, region, layer or section from another element, component, region, layer or section.

The terminology used herein is for the purpose of describing particular embodiments and is not intended to be limiting of the disclosure. As used herein, the singular forms "a", "an" and "the" are intended to include the plural forms as well, unless the context clearly indicates otherwise. Herein, "or" represents "and/or". The term "and/or" used herein includes any or a combination of one or more of the associated listed items. It will be further understood that the terms "comprises", "comprising", "includes" and/or "comprising", when used herein, specify the presence of stated features, regions, integers, steps, operations, elements, and/or components, but do not preclude the presence or addition of one or more other features, regions, integers, steps, operations, elements, components, and/or groups thereof.

Moreover, relative terms such as "below" or "bottom" and "above" or "top" may serve to describe the relation between one element and another element in the text according to the illustration of the drawings. It should also be understood that the relative terms are intended to include different orientations of a device in addition to the orientation shown in the drawings. For instance, if a device in the drawings is flipped, an element described as being disposed "below" other elements shall be re-orientated to be "above" other elements. Thus, the exemplary term "below" may cover the orientations of "below" and "above", depending on a specific orientation of the drawings. Similarly, if a device in a figure is flipped over, the element originally described to be located "below" or "underneath" other element is oriented to be located "on" the other element. Therefore, the illustrative term "under" or "below" may include orientations of "above" and "under".

The term "approximately" or "substantially" as used herein is inclusive of the stated value and means within an acceptable range of deviation for the particular value as determined by persons of ordinary skill in the art, considering the measurement in question and the error associated with measurement of the particular quantity (i.e., the limitations of the measurement system). For instance, "approximately" may mean within one or more standard deviations, or within, for instance, ±30%, ±20%, ±15%, ±10%, ±5% of the stated value. Moreover, a relatively acceptable range of deviation or standard deviation may be chosen for the term "approximately" or "substantially" as used herein based on optical properties, etching properties or other properties, instead of applying one standard deviation across all the properties.

Unless otherwise defined, all terms (comprising technical and scientific terms) used herein have the same meaning as commonly understood by persons of ordinary skill in the art. It will be further understood that terms, such as those defined in commonly used dictionaries, should be interpreted as having a meaning that is consistent with their meaning in the context of the relevant art and the disclosure and will not be interpreted in an idealized or overly formal sense unless expressly so defined herein.

FIG. 1 is a schematic cross-sectional view of a display apparatus 10 according to an embodiment of the disclosure.

Figure 2:
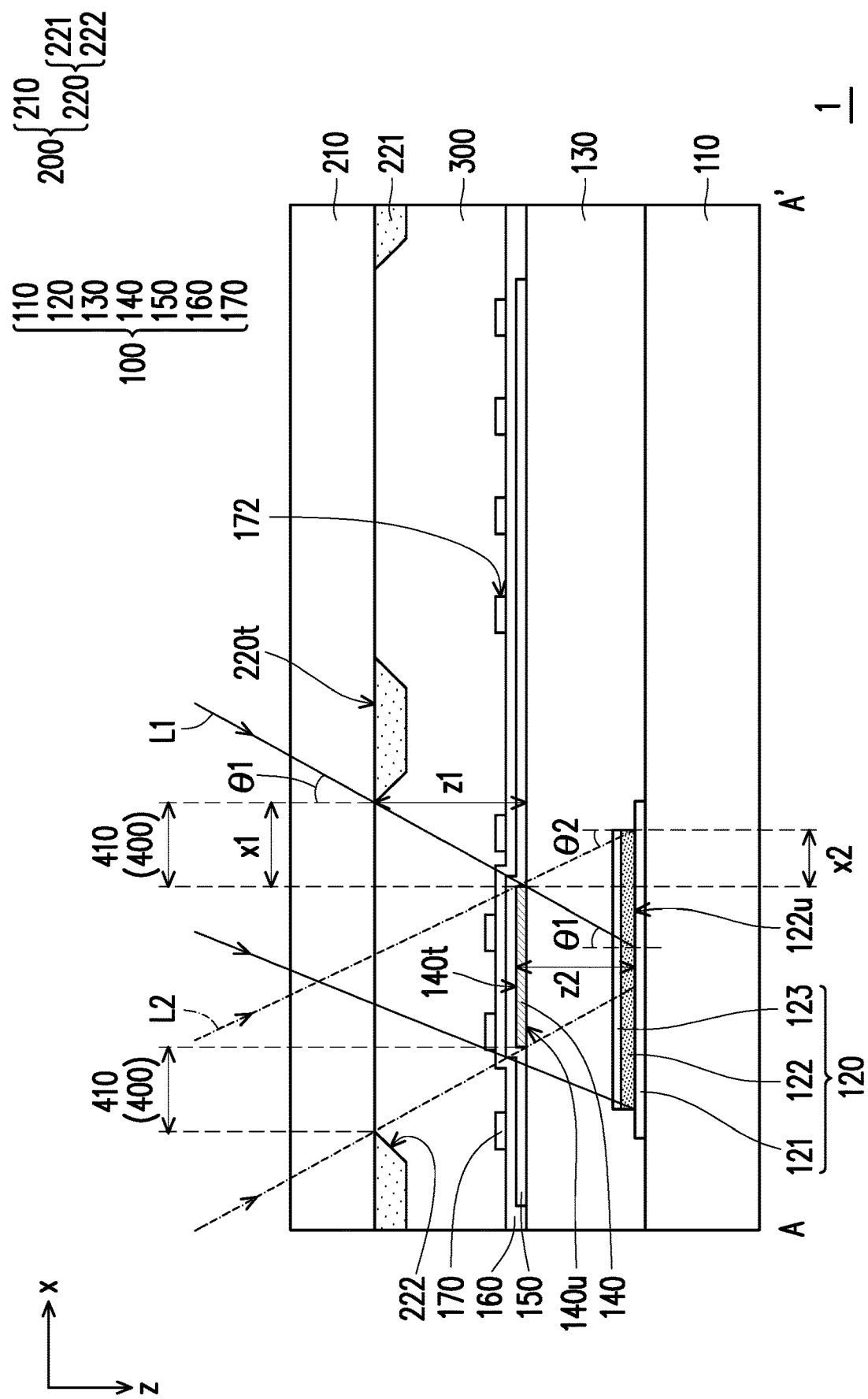
FIG. 2 is a schematic cross-sectional view of a display panel 1 of a display apparatus 10 according to an embodiment of the disclosure.

FIG. 2 is a schematic cross-sectional view of a display panel 1 of a display apparatus 10 according to an embodiment of the disclosure.

Figure 3:
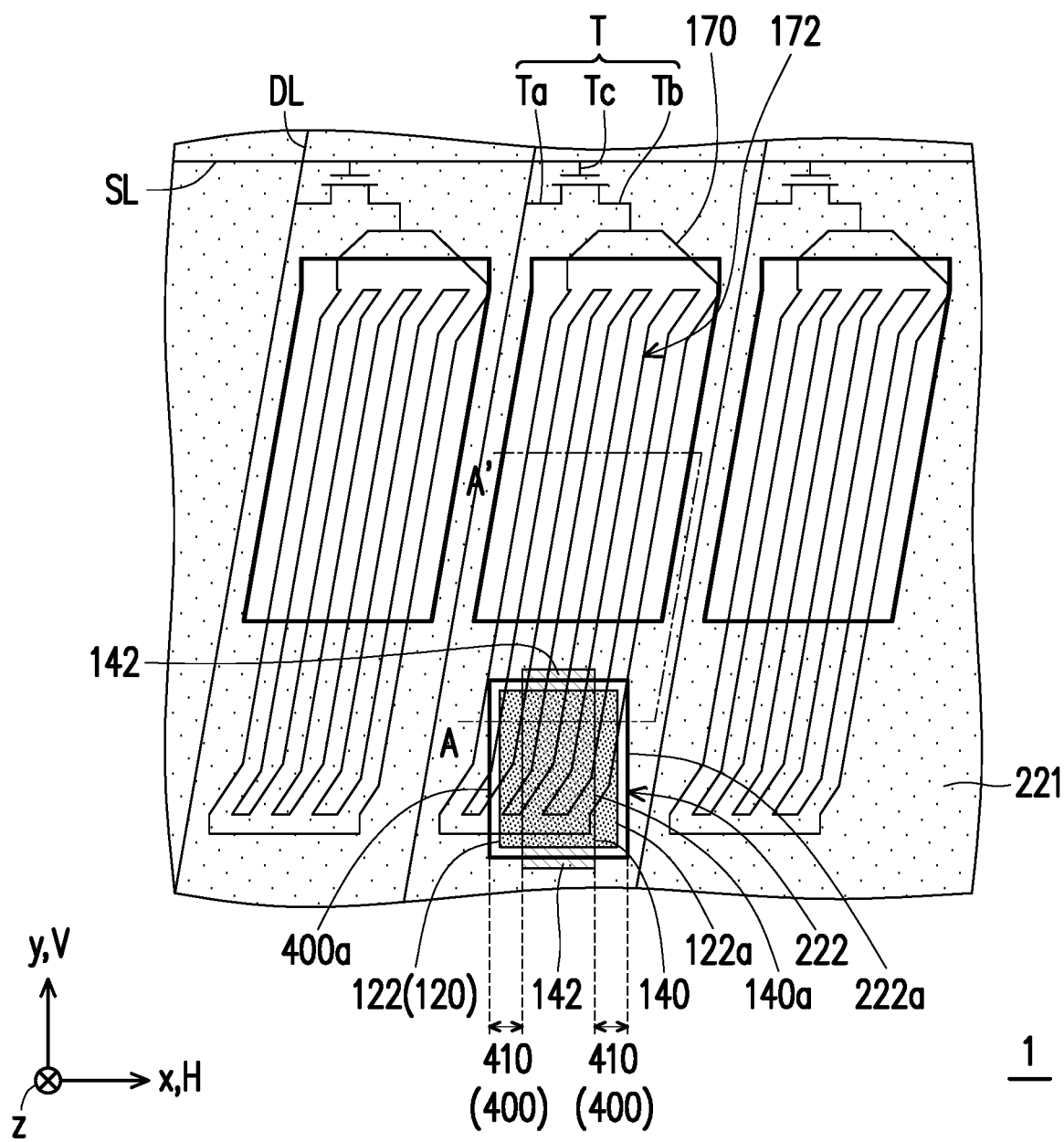
FIG. 3 is a schematic top view of a display panel 1 of a display apparatus 10 according to an embodiment of the disclosure.

FIG. 3 is a schematic top view of a display panel 1 of a display apparatus 10 according to an embodiment of the disclosure.

FIG. 2 corresponds to a sectional line A-A' in FIG. 3. A first substrate 110, an insulation layer 130, an insulation layer 160, a display medium 300, a common electrode 150, and a second substrate 210 depicted in FIG. 2 are omitted from FIG. 3.

With reference to FIG. 1 and FIG. 2, a display apparatus 10 includes a display panel 1. The display panel 1 has a pixel array substrate 100, an opposite substrate 200 relative to the pixel array substrate 100, and a display medium 300 disposed between the pixel array substrate 100 and the opposite substrate 200.

For instance, in the embodiment, the display medium 300 may be a non-self-luminescent display medium (including but not limited to liquid crystal), and the display apparatus 10 may further include a backlight module 2 disposed below the display panel 1. However, the disclosure is not limited thereto. According to other embodiments, the display medium 300 may also be a self-luminescent display medium including but not limited to: organic light-emitting diode (OLED) or quantum dot light-emitting diode (LED). The backlight module 2 may also be omitted from the display apparatus 10.

With reference to FIG. 1, FIG. 2, and FIG. 3, in addition to a display function, the display panel 1 may also perform a light sensing function. Specifically, the display panel 1 includes a plurality of pixel structures PX for display and a plurality of light sensors 120 for sensing light. For instance, in the embodiment, the light sensors 120 may receive a plurality of light beams L1 and L2 reflected by a fingerprint F, so as to obtain a fingerprint image for fingerprint recognition. That is, in the embodiment, the display panel 1 may be an in-cell fingerprint panel, whose structure is described below with reference to the drawings.

As shown in FIG. 2 and FIG. 3, the pixel array substrate 100 includes a first substrate 110. The first substrate 110 mainly serves to hold the components of the pixel array substrate 100. In the embodiment, the material of the first substrate 110 may be glass, quartz, organic polymer, or an opaque/reflective material (for instance, wafer, ceramics, or other suitable materials), or other suitable materials.

The pixel array substrate 100 further includes a plurality of pixel structure PX. The pixel structure PX are disposed on the first substrate 110. Each of the pixel structures PX includes an active device T and a pixel electrode 170 electrically connected to the active device T. In the embodiment, each of the pixel structures PX further includes a data line DL and a scan line SL, wherein a first terminal Ta of the active device T is electrically connected to the data line DL, a control terminal Tc of the active device T is electrically connected to the scan line SL, and a second terminal Tb of the active device T is electrically connected to the pixel electrode 170. The active device T is, for instance, a thin film transistor, which should however not be construed as a limitation in the disclosure.

The display panel 1 further includes a common electrode 150 (shown in FIG. 2), the potential difference between the common electrode 150 and the pixel electrodes 170 of the pixel structures PX allows the display medium 300 to be driven, so that the display panel 1 displays images.

For instance, in the embodiment, the common electrode 150 may be selectively disposed on the first substrate 110, the common electrode 150 and the pixel electrode 170 are overlapped, and an insulation layer 160 is sandwiched between the common electrode 150 and the pixel electrode 170. Specifically, in the embodiment, the insulation layer 160 may be disposed on the common electrode 150, and the pixel electrode 170 may be disposed on the insulation layer 160 and may have a plurality of alignment slits 172. That is, in the embodiment, the pixel electrode 170 may be disposed above the common electrode 150 to form a top-pixel structure. However, the disclosure is not limited thereto. In another embodiment, the common electrode 150 may also be disposed on the pixel electrode 170 and may have an alignment slit to form a top-com structure; in still another embodiment, the common electrode 150 may be disposed on the second substrate 210.

The pixel array substrate 100 further includes a light sensor 120. The light sensor 120 is disposed on the first substrate 110. In the embodiment, the light sensor 120 includes a lower electrode 121, a light sensing layer 122 disposed on the lower electrode 121, and an upper electrode 123 disposed on the light sensing layer 122, wherein the upper electrode 123 is a transparent or translucent electrode. For instance, in the embodiment, the material of the light sensing layer 122 may include silicon-rich oxide (SRO), but the disclosure is not limited thereto.

The pixel array substrate 100 further includes an insulation layer 130. The insulation layer 130 is disposed on the light sensor 120. In the embodiment, the material of the insulation layer 130 may be an inorganic material (e.g., silicon oxide, silicon nitride, silicon oxynitride, or a stacked layer of at least two materials mentioned above), an organic material, or a combination thereof.

The pixel array substrate 100 further includes a first light shielding pattern 140. The first light shielding pattern 140 is disposed on the insulation layer 130 and located above the light sensor 120. The first light shielding pattern 140 does not completely shield the light sensing layer 122 of the light sensor 120. For instance, in the embodiment, the first light shielding pattern 140 may shield the middle area of the light sensing layer 122 but may not shield both sides of the light sensing layer 122; however, the disclosure is not limited thereto. In the embodiment, the material of the first light shielding pattern 140 is, for instance, metal, which should however not be construed as a limitation in the disclosure. In addition, in the embodiment, the first light shielding pattern 140 and the pixel electrode 170 of one of the pixel structures PX may be overlapped, which should however not be construed as a limitation in the disclosure.

The opposite substrate 200 includes a second substrate 210. The second substrate 210 is disposed opposite to the first substrate 110 and mainly serves to hold the components of the opposite substrate 200. In the embodiment, the material of the second substrate 210 may be glass, quartz, organic polymer, or an opaque/reflective material (e.g., wafer, ceramics, or other suitable materials), or other suitable materials.

The opposite substrate 200 also includes a second light shielding pattern 220. The second light shielding pattern 220 is disposed on the second substrate 210 and has an opening 222. In particular, the opening 222 of the second light shielding pattern 220 and the first light shielding pattern 140 define at least one slit 400, and the at least one of the slit 400 and the light sensor 120 are partially overlapped.

For instance, in the embodiment, the opening 222 of the second light shielding pattern 220 and the first light shielding pattern 140 define two opposite first slits 410 which are separated by the first light shielding pattern 140 and are respectively overlapped with the two sides of the light sensing layer 122 of the light sensor 120. In addition, long sides 400a of the slits 400 are arranged along a long side direction y, two end portions 142 of the first light shielding pattern 140 are arranged on the long side direction y, and the two end portions 142 of the first light shielding pattern 140 and a physical portion 221 of the second light shielding pattern 220 are overlapped.

It is worth mentioning that, the at least one slit 400 defined by the first light shielding pattern 140 and the second light shielding pattern 220 respectively located at the first substrate 110 and the second substrate 210 may limit incident angles θ1 and θ2 of the light beams L1 and L2 transmitted to the light sensing layer 122 to equal to or smaller than a certain angle. As a result, the light sensors 120 of the display panel 1 may obtain the fingerprint image of higher clarity, which is conducive to fingerprint recognition.

With reference to FIG. 2 and FIG. 3, for instance, in the embodiment, a distance x1 is between a long side 140a of the first light shielding pattern 140 and an edge 222a of the opening 222 of the second light shielding pattern 220 in a first direction x parallel to the first substrate 110, and a distance z1 is between a surface 220t of the second light shielding pattern 220 facing the second substrate 210 and a surface 140u of the first light shielding pattern 140 facing the first substrate 110 in a second direction z perpendicular to the first substrate 110. The distance x1 and the distance z1 satisfy the following formula:

$$15° < \tan^{-1}\left(\frac{x1}{z1}\right) < 35°.$$

In addition, in the embodiment, a distance x2 is between the long side 140a of the first light shielding pattern 140 and the edge 122a of the light sensing layer 122 of the light sensor 120 in the first direction x parallel to the first substrate 110, and a distance z2 is between a surface 122u of the light sensing layer 122 facing the first substrate 110 and a surface 140t of the first light shielding pattern 140 facing the second substrate 210 in the second direction z perpendicular to the first substrate 110. The distance x2 and the distance z2 satisfy the following formula:

$$15° < \tan^{-1}\left(\frac{x2}{z2}\right) < 35°.$$

As a result, most of the light beams L1 and L2 may be transmitted to the light sensing layer 122 of the light sensor 120 at the incident angles θ1 and θ2 of 35° or less, and the light sensor 120 may receive a sufficient amount of light, which is conducive to obtaining the fingerprint image of sufficient clarity; however, the disclosure is not limited to thereto.

Figure 4:
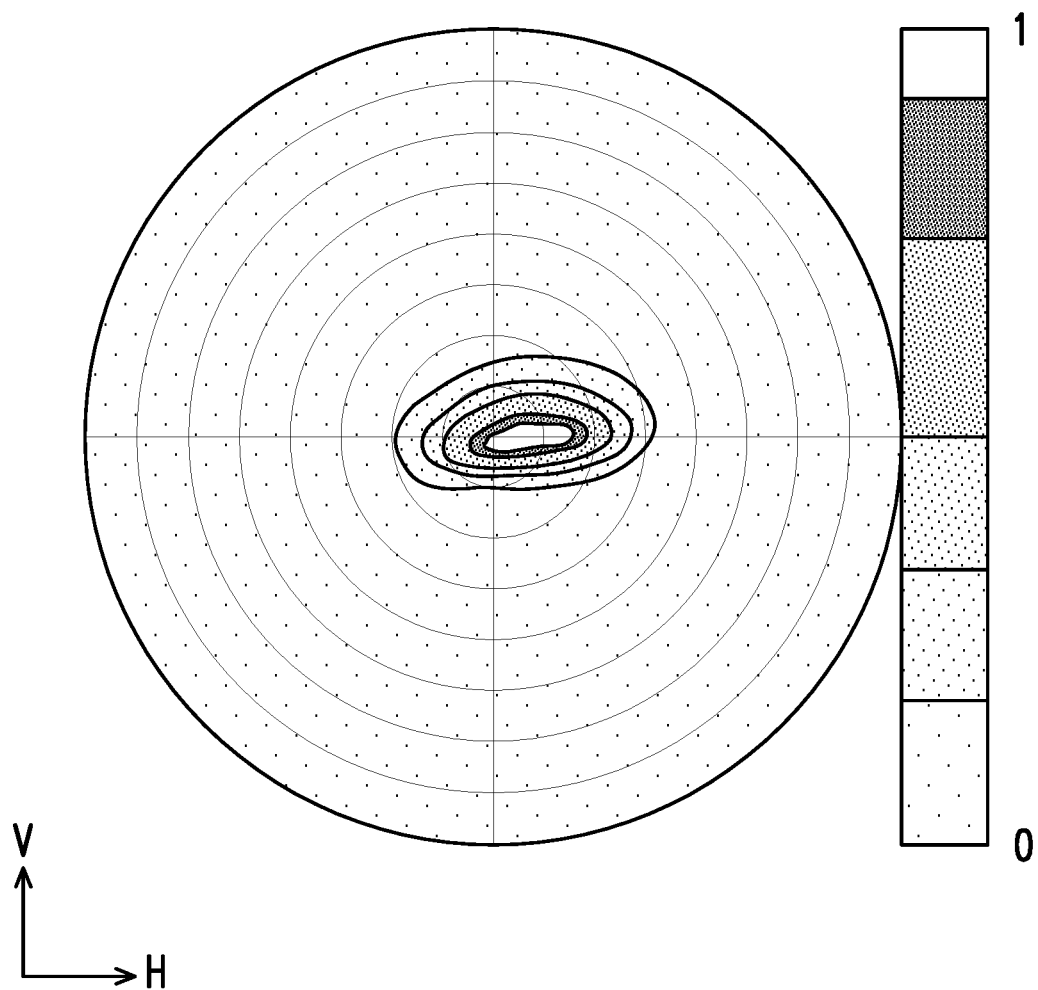
FIG. 4 is a schematic view illustrating a light intensity distribution of a backlight module 2 in each direction according to an embodiment of the disclosure.

FIG. 4 is a schematic view illustrating a light intensity distribution of a backlight module 2 in each direction according to an embodiment of the disclosure.

Figure 5:
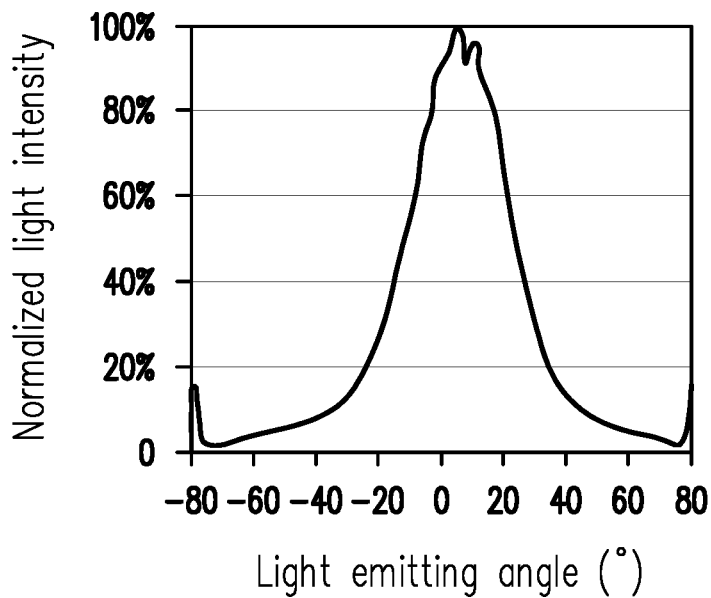
FIG. 5 is a schematic view illustrating the light intensity distribution of the backlight module 2 in a direction H according to an embodiment of the disclosure.

FIG. 5 is a schematic view illustrating the light intensity distribution of the backlight module 2 in a direction H according to an embodiment of the disclosure.

Figure 6:
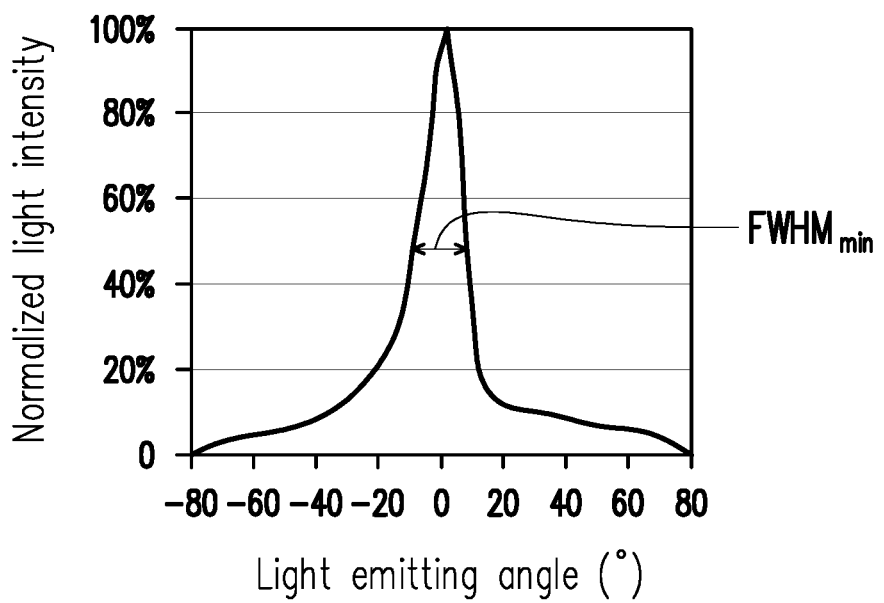
FIG. 6 is a schematic view illustrating the light intensity distribution of the backlight module 2 in a direction V according to an embodiment of the disclosure.

FIG. 6 is a schematic view illustrating the light intensity distribution of the backlight module 2 in a direction V according to an embodiment of the disclosure.

With reference to FIG. 1, FIG. 4, FIG. 5, and FIG. 6, in the embodiment, a unidirectional collimated backlight module may be selected as the backlight module 2. The light intensity distribution of the backlight module 2 in a direction V has a minimum full width at half maximum $FWHM_{min}$. The direction V is the convergence direction of the backlight module 2.

With reference to FIG. 3 and FIG. 4, in the embodiment, the long side 400a of the slit 400 of the display panel 1 is arranged the long side direction y, an included angle α (not shown) is between the long side direction y and the convergence direction of the backlight module 2 (i.e., the direction V), and α<45°. For instance, in the embodiment, it is preferable that the included angle α between the long side direction y of the slit 400 and the convergence direction (i.e., the direction V) of the backlight module 2 is substantially 0°; that is, the long side direction y of the slit 400 and the convergence direction (i.e., the direction V) of the backlight module 2 may be substantially parallel. However, the disclosure is not limited to thereto. According to other embodiments, the included angle between the long side direction y of the slit 400 and the convergence direction of the backlight module 2 may be other than 0° but less than 45°.

In the embodiment, adjustment of the convergence direction of the backlight module 2 and the long side direction y of the slit 400 of the display panel 1 may further enhance the clarity of the fingerprint image while taking the viewing angle of the display apparatus 10 in the direction H.

Note that the backlight module 2 is not limited to be the unidirectional collimated backlight module; in another embodiment, the backlight module 2 may also be a non-unidirectional collimation backlight module; in still another embodiment, the backlight module 2 may be omitted. Regardless of the type of the backlight module 2 of the display apparatus 10 or whether the display apparatus 10 includes the backlight module 2, the display apparatus 10 may, through the slit 400 of the display panel 1, ensure the improvement of the clarity of the fingerprint image.

Figure 7:
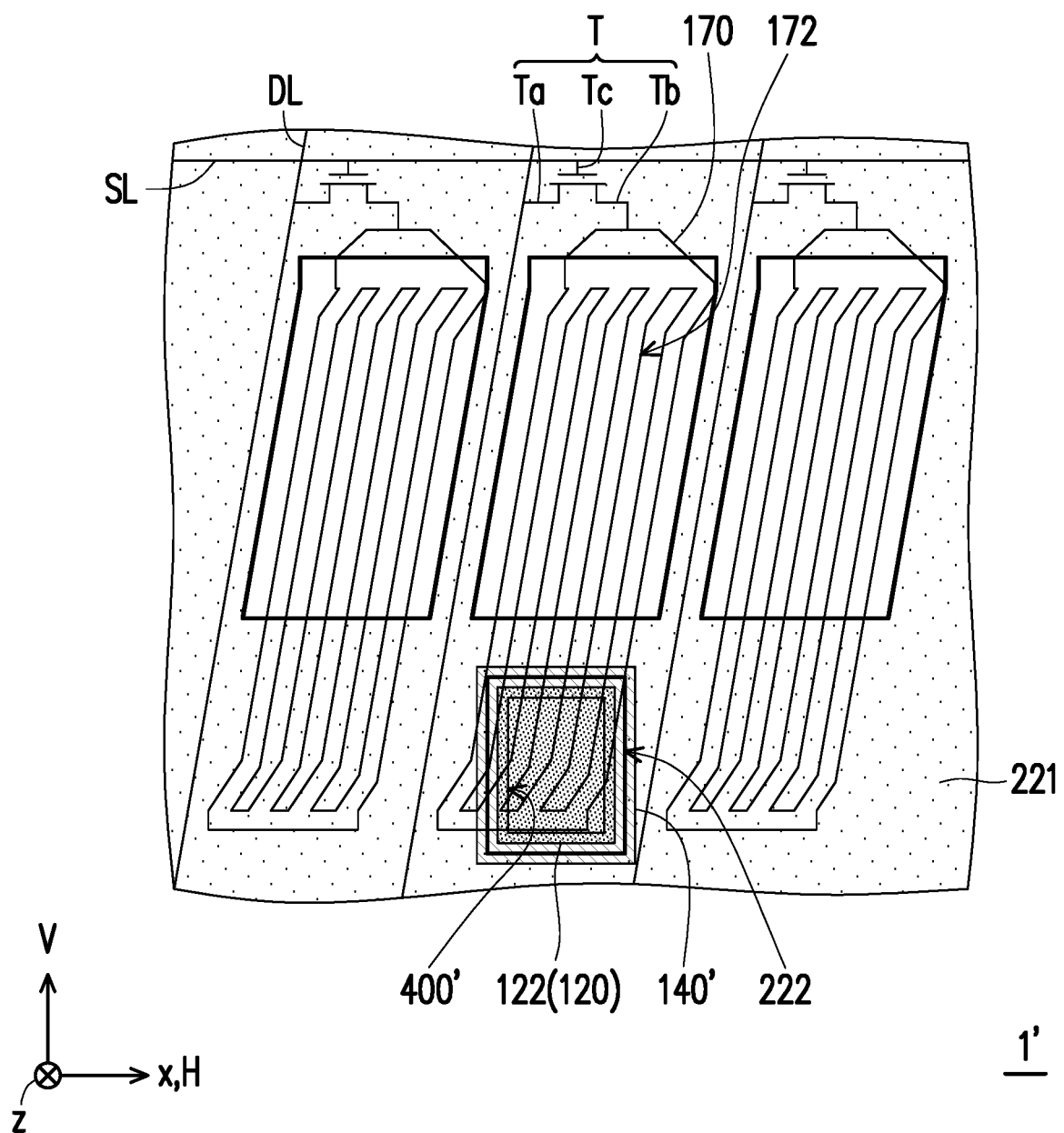
FIG. 7 is a schematic top view of a display panel 1' of a display apparatus 10' according to a first comparative example.

FIG. 7 is a schematic top view of a display panel 1' of a display apparatus 10' according to a first comparative example. The display panel 1' in the first comparative example shown in FIG. 7 is similar to the display panel 1 provided in the embodiment depicted in FIG. 3, and the difference therebetween lies in that the first light shielding pattern 140' and the opening 222 of the second light shielding pattern 220 of the display panel 1' provided in the first comparative example depicted in FIG. 7 define a hole 400' instead of a slit.

Figure 8:
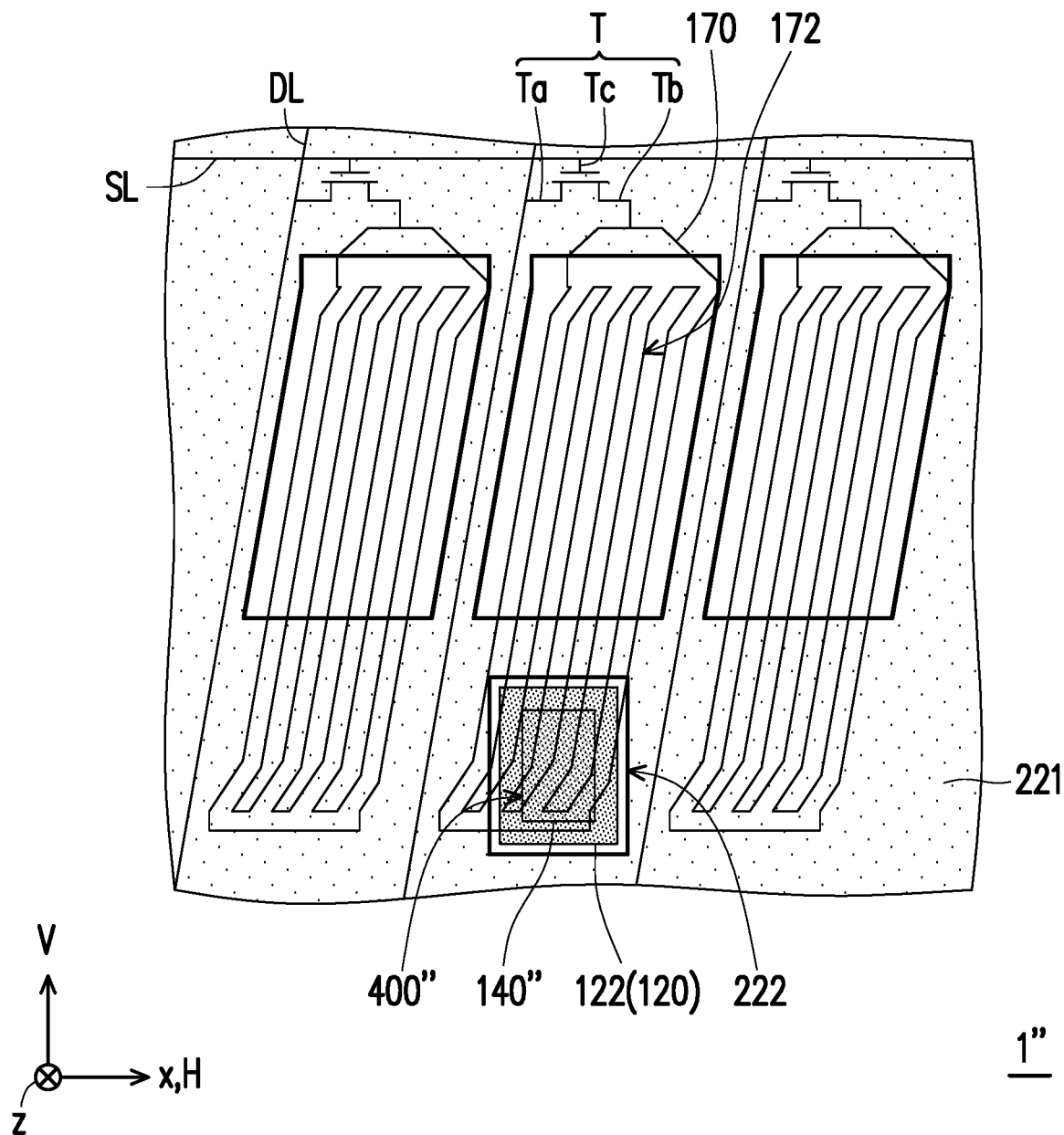
FIG. 8 is a schematic top view of a display panel 1" of a display apparatus 10" according to a second comparative example.

FIG. 8 is a schematic top view of a display panel 1" of a display apparatus 10" according to a second comparative example. The display panel 1" in the second comparative example shown in FIG. 8 is similar to the display panel 1 provided in the embodiment depicted in FIG. 3, and the difference therebetween lies in that the first light shielding pattern 140" and the opening 222 of the second light shielding pattern 220 of the display panel 1" provided in the second comparative example depicted in FIG. 8 define a frame 400" instead of a slit.

Figure 9:
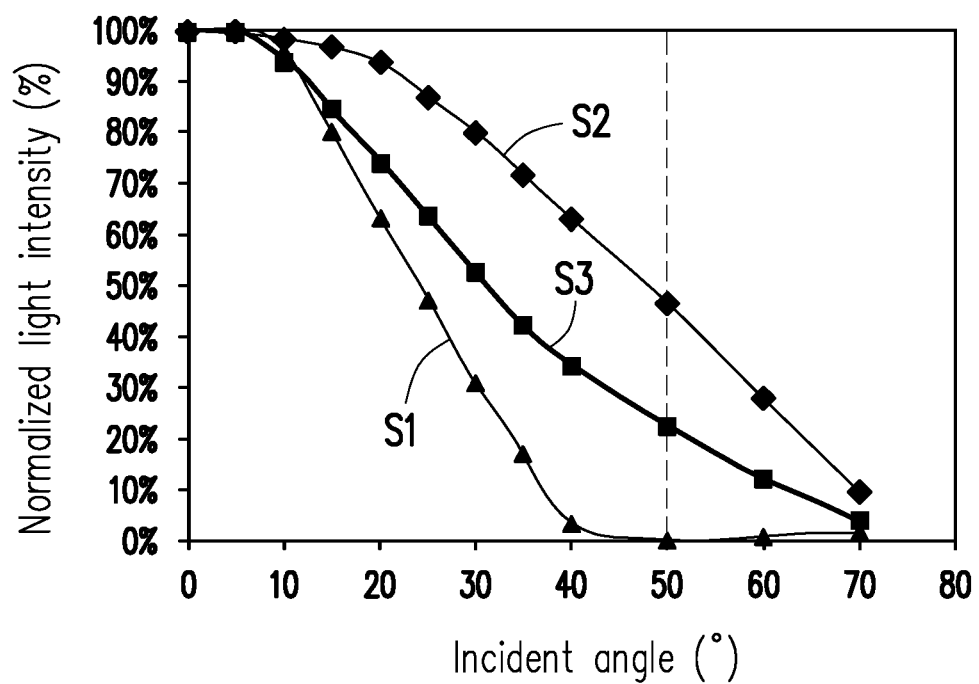
FIG. 9 shows a relationship between a normalized light intensity and an incident angle of a light beam received by a light sensor 200 provided in the embodiment depicted in FIG. 3, the first comparative example depicted in FIG. 7, and the second comparative example depicted in FIG. 8.

FIG. 9 shows a relationship between a normalized light intensity and an incident angle of a light beam received by a light sensor 200 provided in the embodiment depicted in FIG. 3, the first comparative example depicted in FIG. 7, and the second comparative example depicted in FIG. 8, wherein a curve S1 represents the relationship between the incident angle of the light beam received by the light sensor 120 in the embodiment depicted in FIG. 3 and the normalized light intensity, a curve S2 represents the relationship between the incident angle of the light beam received by the light sensor 120 in the embodiment depicted in FIG. 7 and the normalized light intensity, and a curve S3 represents the relationship between the incident angle of the light beam received by the light sensor 120 in the embodiment depicted in FIG. 8 and the normalized light intensity.

As shown in FIG. 9, the slit 400 defined by the first light shielding pattern 140 and the opening 222 of the second light shielding pattern 220 in the display apparatus 10 provided in an embodiment of the disclosure allows the incident angles θ1 and θ2 (shown in FIG. 2) of most of the light beams L1 and L2 (shown in FIG. 2) transmitted to the light sensor 120 to be limited to less than 35°, which is different from the first and second comparative examples depicted in FIG. 7 and FIG. 8, i.e., the light sensor 120 receives the light beam at a large incident angle (for instance, greater than 50°). Therefore, compared with the first and second comparative examples, the display apparatus 10 provided in an embodiment of the disclosure can obtain a fingerprint image of higher clarity.

Note that the reference numbers and parts of the descriptions provided in the above embodiments are applied in the following embodiment, the same reference numbers serve to indicate the same or similar components, and the description of the same technical content is omitted. For the description of the omitted parts, reference may be made to the foregoing embodiments, and no further explanation will be provided in the following embodiments.

Figure 10:
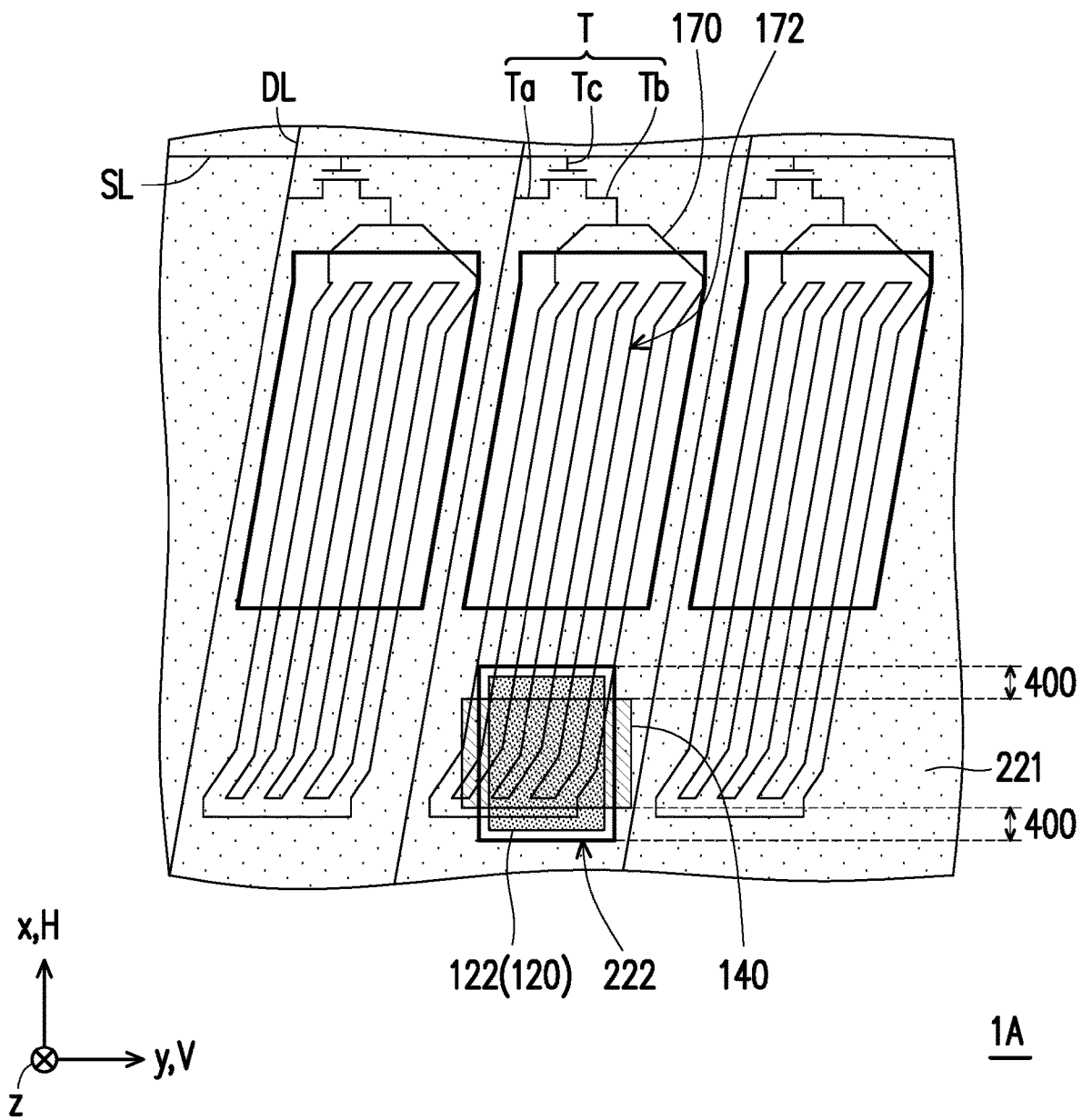
FIG. 10 is a schematic top view of a display panel 1A according to another embodiment of the disclosure.

FIG. 10 is a schematic top view of a display panel 1A according to another embodiment of the disclosure. The display panel 1A depicted in FIG. 10 is similar to the display panel 1 depicted in FIG. 3. The difference therebetween lies in that the long side direction y of the slit 400 depicted in FIG. 3 is substantially perpendicular to the arrangement direction of the data lines DL, but the long side direction y of the slit 400 depicted in FIG. 10 is substantially the same as the arrangement direction of the data lines DL.

Figure 11:
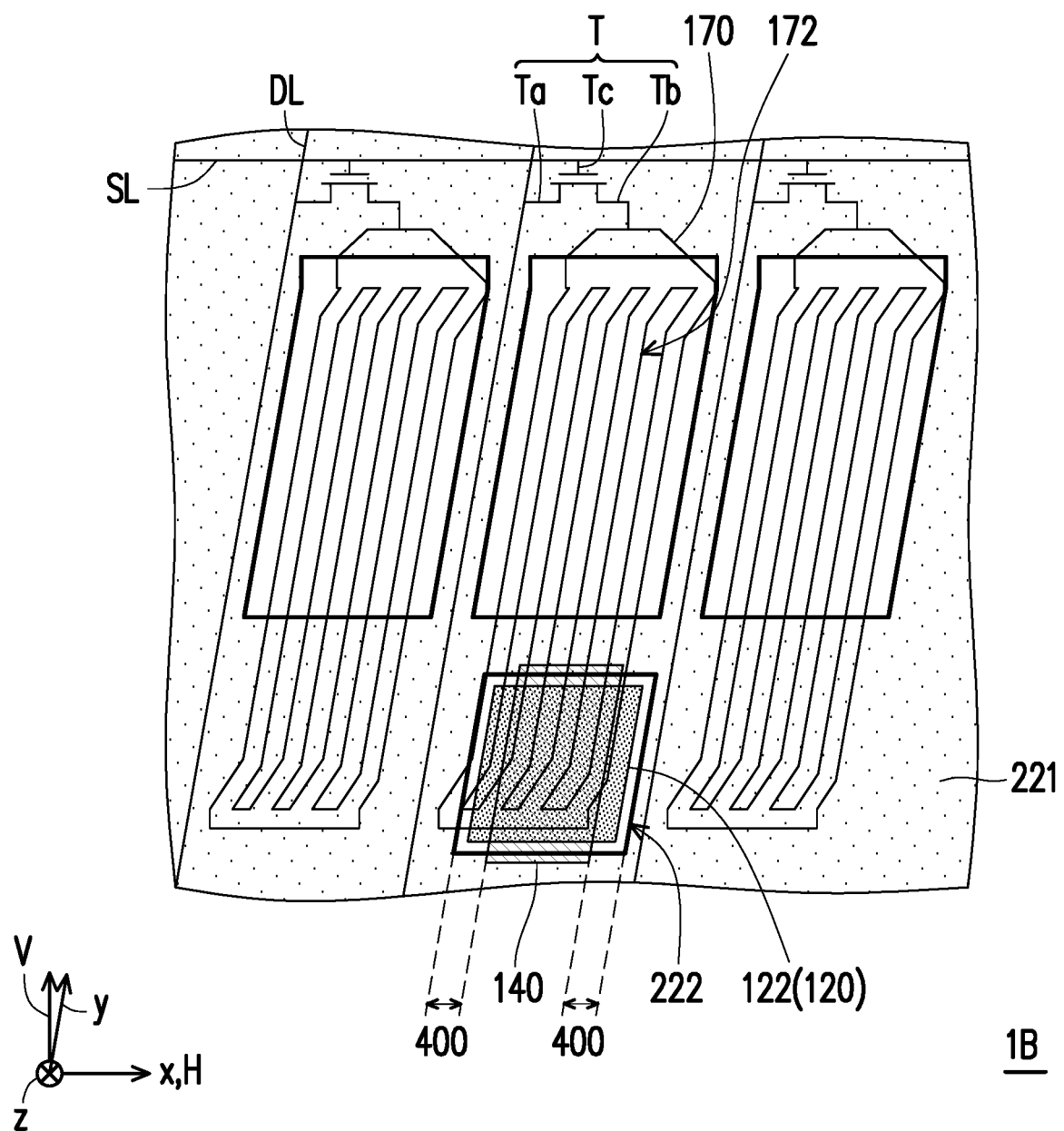
FIG. 11 is a schematic top view of a display panel 1B according to another embodiment of the disclosure.

FIG. 11 is a schematic top view of a display panel 1B according to another embodiment of the disclosure. The display panel 1B depicted in FIG. 11 is similar to the display panel 1 depicted in FIG. 3, and the difference therebetween lies in that the first light shielding pattern 140 and the opening 222 of the second light shielding pattern 220 depicted in FIG. 3 are rectangular, and the first light shielding pattern 140 and the opening 222 of the second light shielding pattern 220 depicted in FIG. 11 are parallelograms and not rectangular.

Figure 12:
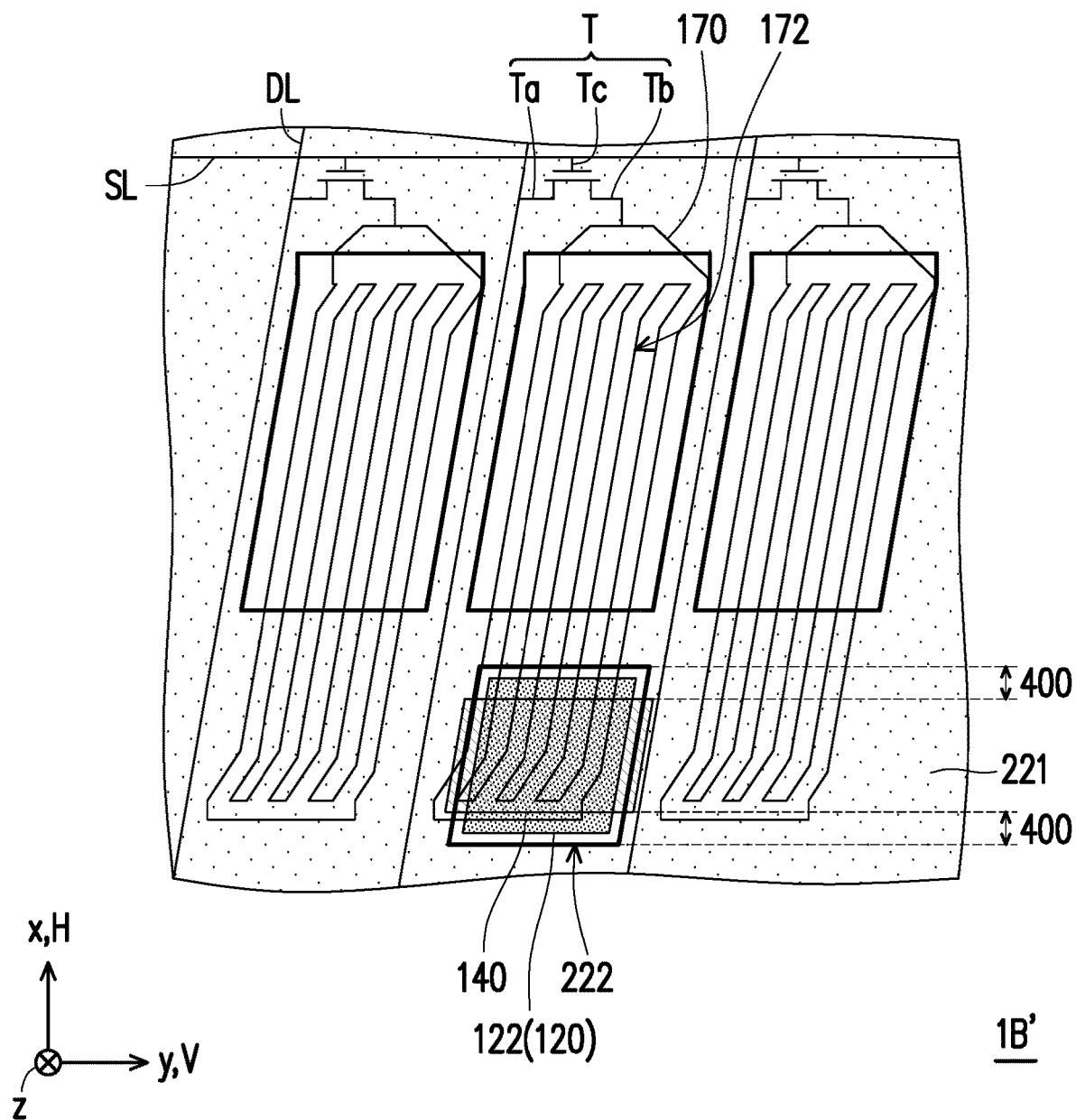
FIG. 12 is a schematic top view of a display panel 1B' according to another embodiment of the disclosure.

FIG. 12 is a schematic top view of a display panel 1B' according to another embodiment of the disclosure. The display panel 1B' depicted in FIG. 12 is similar to the display panel 1B depicted in FIG. 11, and the difference therebetween lies in that the long side direction y of the slit 400 and the arrangement direction of the data lines DL are staggered in the embodiment depicted in FIG. 12, but the long side direction y of the slit 400 defined by the first light shielding pattern 140 and the opening 222 of the second light shielding pattern 220 is consistent with the arrangement direction of the data lines L.

Figure 13:
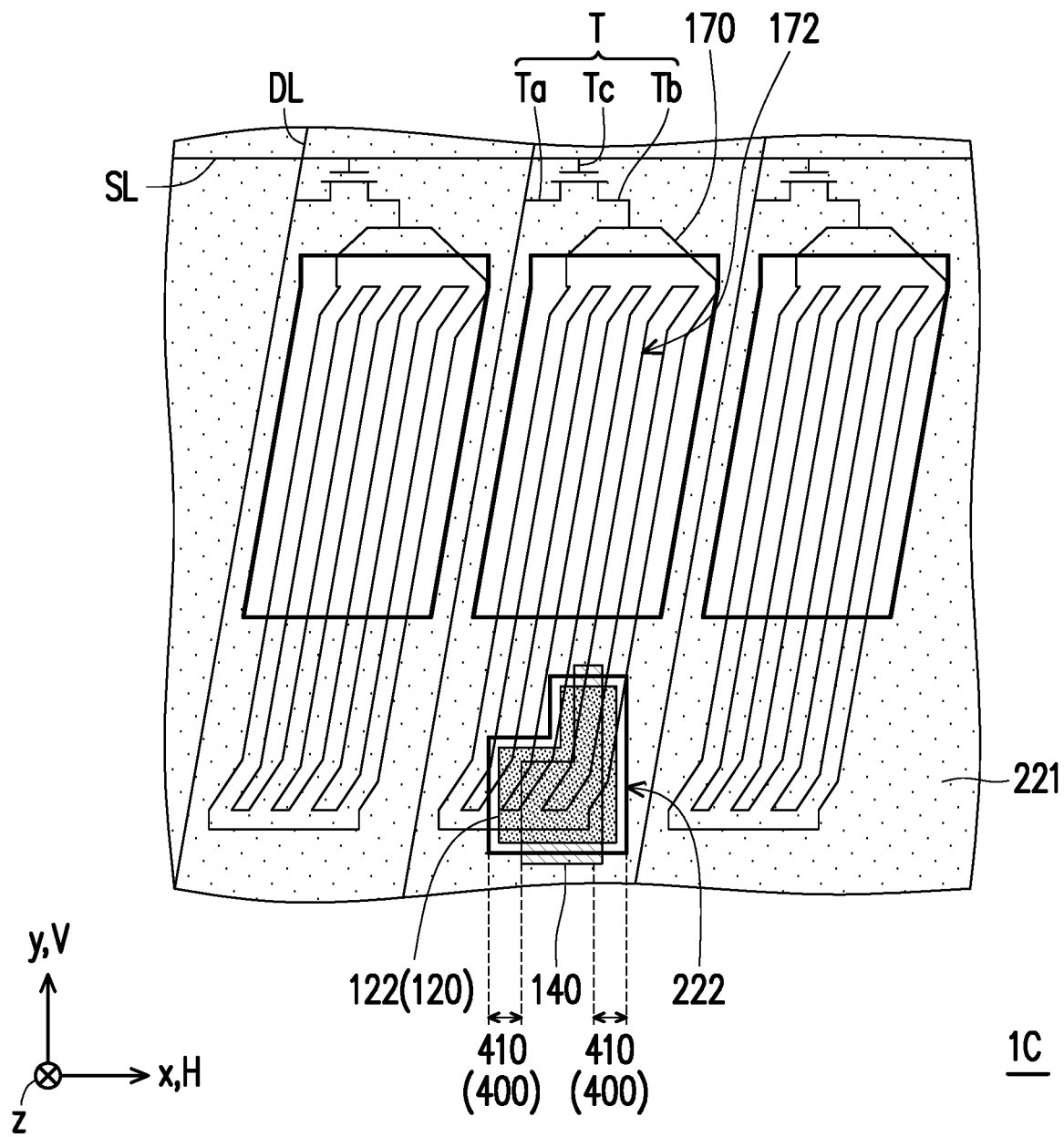
FIG. 13 is a schematic top view of a display panel 1C according to an embodiment of the disclosure.

FIG. 13 is a schematic top view of a display panel 1C according to an embodiment of the disclosure. The display panel 1C depicted in FIG. 13 is similar to the display panel 1 depicted in FIG. 3, and the difference therebetween lies in that the first light shielding pattern 140 and the opening 222 of the second light shielding pattern 220 depicted in FIG. 3 are rectangular, while the first light shielding pattern 140 and the opening 222 of the second light shielding pattern 220 depicted in FIG. 13 is irregular, and the shapes of the two opposite first slits 410 are different in FIG. 13.

Figure 14:
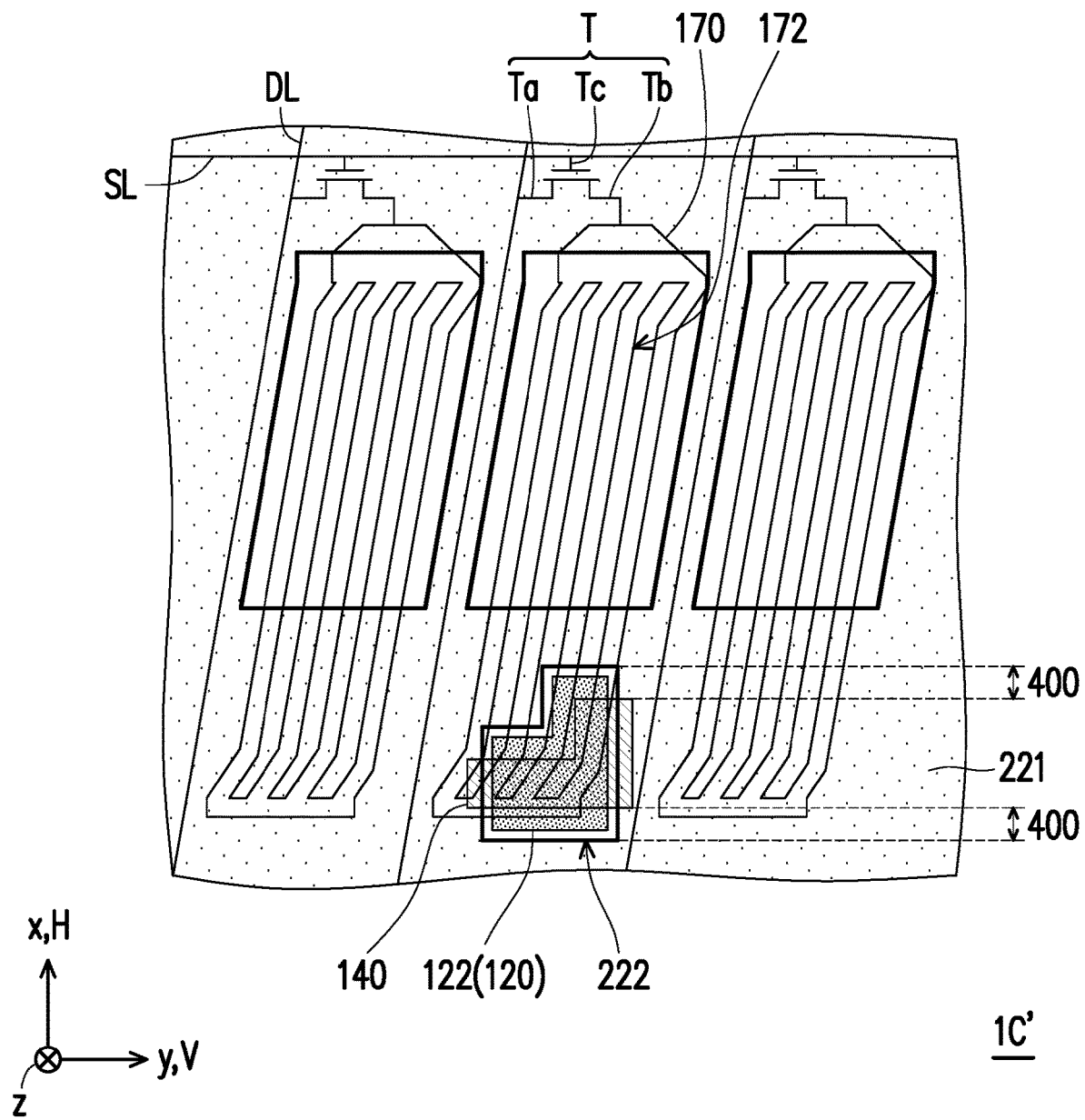
FIG. 14 is a schematic top view of a display panel 1C' according to another embodiment of the disclosure.

FIG. 14 is a schematic top view of a display panel 1C' according to another embodiment of the disclosure. The display panel 1C' depicted in FIG. 14 is similar to the display panel 1C depicted in FIG. 13, and the difference therebetween lies in that the long side direction y of the slit 400 and the arrangement direction of the data lines DL are stagger in the embodiment depicted in FIG. 13, while the long side direction y of the slit 400 defined by the first light shielding pattern 140 and the opening 222 of the second light shielding pattern 220 is consistent with the arrangement direction of the data lines DL in the embodiment depicted in FIG. 14.

Figure 15:
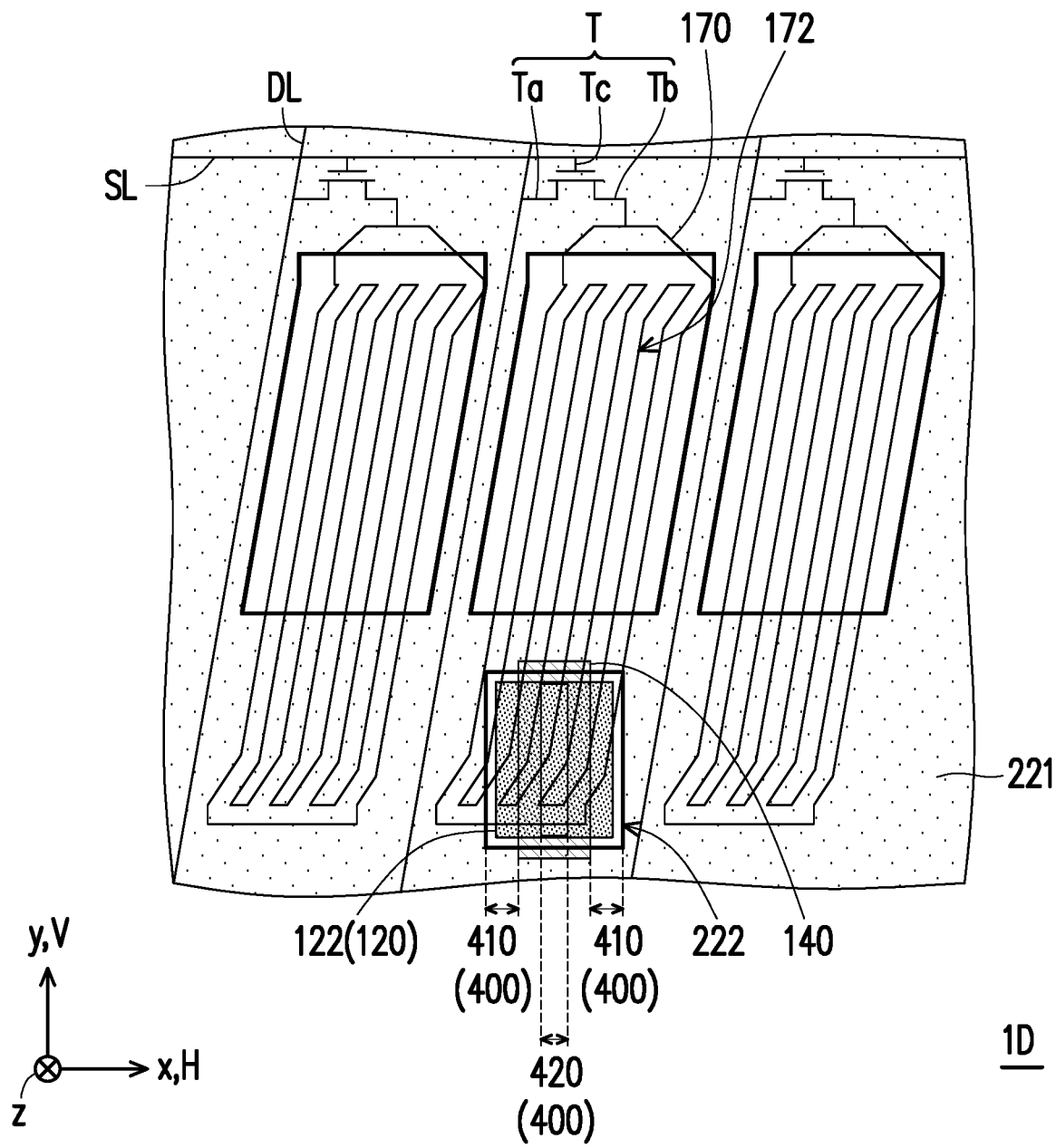
FIG. 15 is a schematic top view of a display panel 1D according to another embodiment of the disclosure.

FIG. 15 is a schematic top view of a display panel 1D according to another embodiment of the disclosure. The display panel 1D depicted in FIG. 15 is similar to the display panel 1 depicted in FIG. 3, and the difference therebetween lies in that the first light shielding pattern 140 and the opening 222 of the second light shielding pattern 220 of the display panel 1 depicted in FIG. 3 define the two opposite first slits 410; the first light shielding pattern 140 and the opening 222 of the second light shielding pattern 220 of the display panel 1D depicted in FIG. 15 not only define the two opposite first slits but also define a second slit 420. The second slit 420 is located inside the first light shielding pattern 140. The second slit 420 may be an opening inside the first light shielding pattern 140.

Figure 16:
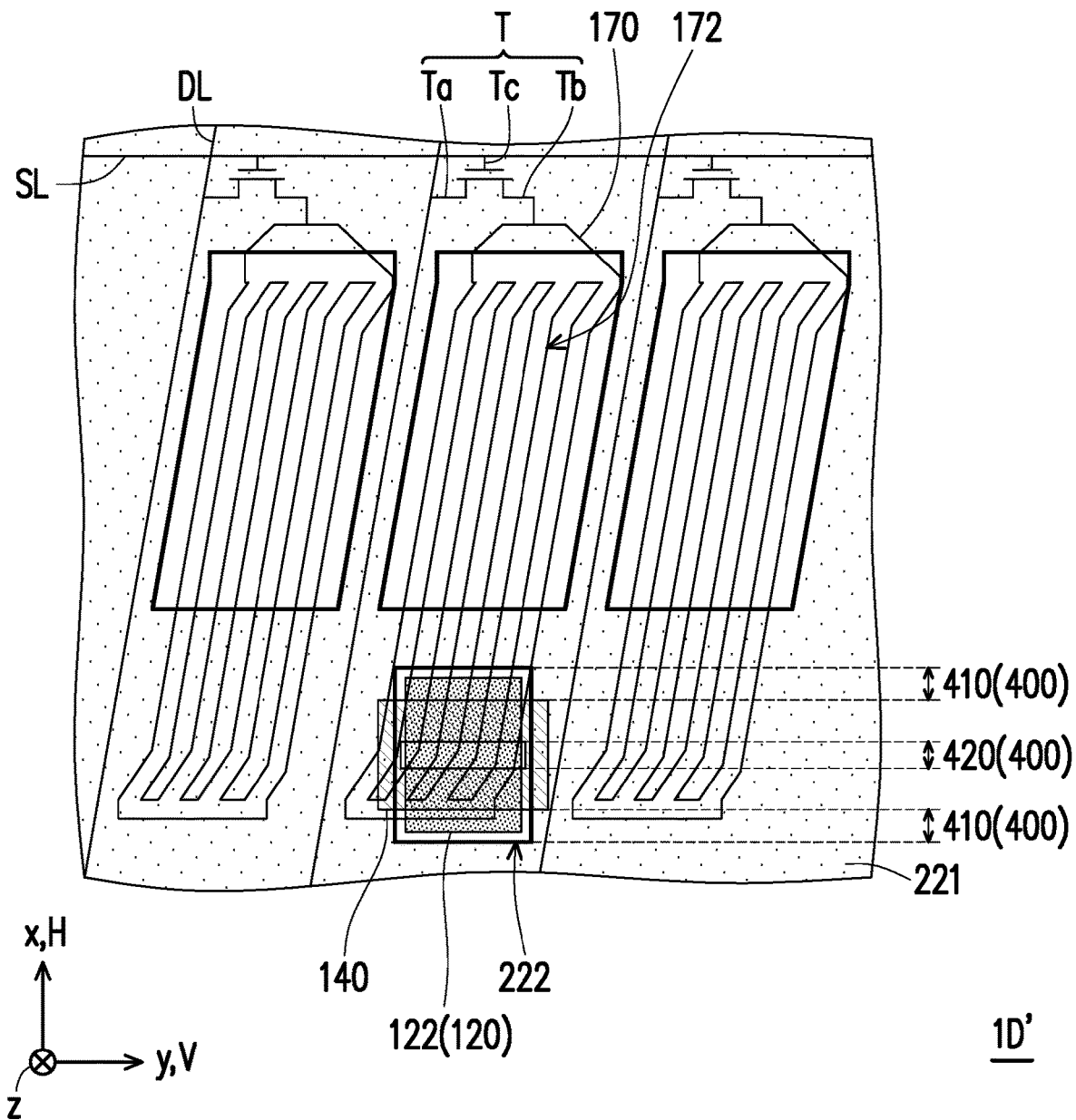
FIG. 16 is a schematic top view of a display panel 1D' according to another embodiment of the disclosure.

FIG. 16 is a schematic top view of a display panel 1D' according to another embodiment of the disclosure. The display panel 1D' depicted in FIG. 16 is similar to the display panel 1D depicted in FIG. 13, and the difference therebetween lies in that the long side direction y of the slit 400 and the arrangement direction of the data lines DL are staggered in the embodiment depicted in FIG. 15, while the long side direction y of the slit 400 defined by the first light shielding pattern 140 and the opening 222 of the second light shielding pattern 220 is consistent with the arrangement direction of the data lines DL in the embodiment depicted in FIG. 16.

It will be apparent to those skilled in the art that various modifications and variations can be made to the disclosed embodiment without departing from the scope or spirit of the disclosure. In view of the foregoing, it is intended that the disclosure covers modifications and variations provided that they fall within the scope of the following claims and their equivalents.

What is claimed is:

1. A display apparatus, comprising:
a first substrate;
a plurality of pixel structures, disposed on the first substrate, wherein each of the pixel structures comprises an active device and a pixel electrode electrically connected to the active device;
a light sensor, disposed on the first substrate;
an insulation layer, disposed on the light sensor;
a first light shielding pattern, disposed on the insulation layer and located above the light sensor;
a second substrate, disposed opposite to the first substrate;
a second light shielding pattern, disposed on the second substrate and having an opening, wherein the opening of the second light shielding pattern and the first light shielding pattern define at least one slit, and the at least one slit and the light sensor are partially overlapped;
a display medium, disposed between the first substrate and the second substrate; and
a backlight module, wherein a light intensity distribution of the backlight module in a convergence direction has a minimum full width at half maximum, a long side of the at least one slit is arranged along a long side direction, an included angle α is between the long side direction and the convergence direction, and α<45°.

2. The display apparatus according to claim 1, wherein a distance x1 is between a long side of the first light shielding pattern and an edge of the opening of the second light shielding pattern in a first direction parallel to the first substrate, a distance z1 is between a surface of the second light shielding pattern facing the second substrate and a surface of the first light shielding pattern facing the second substrate in a second direction perpendicular to the first substrate, and the distance x1 and the distance z1 satisfy a formula:

$$15° < \tan^{-1}\left(\frac{x1}{z1}\right) < 35°.$$

3. The display apparatus according to claim 1, wherein a distance x2 is between a long side of the first light shielding pattern and an edge of a light sensing layer of the light sensor in a first direction parallel to the first substrate, a distance z2 is between a surface of the light sensing layer facing the first substrate and a surface of the first light shielding pattern facing the second substrate in a second direction perpendicular to the first substrate, and the distance x2 and the distance z2 satisfy a formula:

$$15° < \tan^{-1}\left(\frac{x2}{z2}\right) < 35°.$$

4. The display apparatus according to claim 1, wherein a long side of the at least one slit is arranged along a long side direction, two end portions of the first light shielding pattern are arranged in the long side direction, and the two end portions of the first light shielding pattern and a physical portion of the second light shielding pattern are overlapped.

5. The display apparatus according to claim 1, wherein the at least one slit comprises two opposite first slits separated by the first light shielding pattern.

6. The display apparatus according to claim 5, wherein the at least one slit further comprises a second slit located in the first light shielding patterns.

7. The display apparatus according to claim 1, wherein the first light shielding pattern and the pixel electrode of one of the pixel structures are overlapped.

8. A display apparatus, comprising:
a first substrate;
a plurality of pixel structures, disposed on the first substrate, wherein each of the pixel structures comprises an active device and a pixel electrode electrically connected to the active device;
a light sensor, disposed on the first substrate;
an insulation layer, disposed on the light sensor;
a first light shielding pattern, disposed on the insulation layer and located above the light sensor;
a second substrate, disposed opposite to the first substrate;
a second light shielding pattern, disposed on the second substrate and having an opening, wherein the opening of the second light shielding pattern and the first light shielding pattern define at least one slit, and the at least one slit and the light sensor are partially overlapped; and
a display medium, disposed between the first substrate and the second substrate, wherein the at least one slit comprises two opposite first slits separated by the first light shielding pattern.

9. The display apparatus according to claim 8, wherein a long side of the at least one slit is arranged along a long side direction, two end portions of the first light shielding pattern are arranged in the long side direction, and the two end portions of the first light shielding pattern and a physical portion of the second light shielding pattern are overlapped.

10. The display apparatus according to claim 8, wherein the at least one slit further comprises a second slit located in the first light shielding patterns.

11. The display apparatus according to claim 8, wherein the first light shielding pattern and the pixel electrode of one of the pixel structures are overlapped.

12. A display apparatus, comprising:
a first substrate;
a plurality of pixel structures, disposed on the first substrate, wherein each of the pixel structures comprises an active device and a pixel electrode electrically connected to the active device;
a light sensor, disposed on the first substrate;
an insulation layer, disposed on the light sensor;
a first light shielding pattern, disposed on the insulation layer and located above the light sensor;
a second substrate, disposed opposite to the first substrate;
a second light shielding pattern, disposed on the second substrate and having an opening, wherein the opening of the second light shielding pattern and the first light shielding pattern define at least one slit, and the at least one slit and the light sensor are partially overlapped; and
a display medium, disposed between the first substrate and the second substrate, wherein the first light shielding pattern and the pixel electrode of one of the pixel structures are overlapped.

13. The display apparatus according to claim 12, wherein a long side of the at least one slit is arranged along a long side direction, two end portions of the first light shielding pattern are arranged in the long side direction, and the two end portions of the first light shielding pattern and a physical portion of the second light shielding pattern are overlapped.

14. The display apparatus according to claim 12, wherein the at least one slit comprises two opposite first slits separated by the first light shielding pattern, and the at least one slit further comprises a second slit located in the first light shielding patterns.

* * * * *